United States Patent

Kikuyama et al.

[11] Patent Number: 6,027,571
[45] Date of Patent: Feb. 22, 2000

[54] SURFACE TREATMENT FOR MICROMACHINING

[75] Inventors: Hirohisa Kikuyama; Masayuki Miyashita; Tatsuhiro Yabune, all of Osaka-fu; Tadahiro Ohmi, Miyagi-ken, all of Japan

[73] Assignee: Stella Chemifa Kabushiki Kaisha, Osaka-fu, Japan

[21] Appl. No.: 09/066,354

[22] PCT Filed: Aug. 27, 1997

[86] PCT No.: PCT/JP97/02978

§ 371 Date: Apr. 28, 1998

§ 102(e) Date: Apr. 28, 1998

[87] PCT Pub. No.: WO98/09320

PCT Pub. Date: Mar. 5, 1998

[30] Foreign Application Priority Data

Aug. 28, 1996 [JP] Japan ................................. 8-227207

[51] Int. Cl.[7] ........................... C09K 13/00; C09K 13/08; C23G 1/02
[52] U.S. Cl. ............................ 134/3; 252/79.3; 252/79.4
[58] Field of Search ................. 252/79.3, 79.2, 252/79.4; 134/3

[56] References Cited

U.S. PATENT DOCUMENTS

| | | | |
|---|---|---|---|
| 4,582,624 | 4/1986 | Enjo et al. | 252/79.4 |
| 4,761,244 | 8/1988 | Scardera et al. | 252/79.3 |
| 4,795,582 | 1/1989 | Ohmi et al. | 252/79.3 |
| 4,921,572 | 5/1990 | Roche | 252/79.3 |
| 5,277,835 | 1/1994 | Ohmi et al. | 252/79.3 |
| 5,496,485 | 3/1996 | Maternaghan | 252/79.3 |
| 5,755,989 | 5/1998 | Ishii et al. | 252/79.4 |

FOREIGN PATENT DOCUMENTS

| | | | |
|---|---|---|---|
| 63-283028 | 11/1988 | Japan | H01L 21/306 |
| 3-179737 | 8/1991 | Japan | H01L 21/308 |
| 6-163516 | 6/1994 | Japan | H01L 21/308 |
| 7-506616 | 7/1995 | Japan | C09K 13/06 |
| 07226438 | 8/1995 | Japan | H01L 21/768 |
| 09148301 | 6/1997 | Japan | H01L 21/306 |

*Primary Examiner*—Randy Gulakowski
*Assistant Examiner*—Saud Chaudhry
*Attorney, Agent, or Firm*—Randall J. Knuth

[57] ABSTRACT

A fine surface treatment for micromachining having an etching speed whose difference is smaller to oxide films each obtained by a different method as well as conditions of forming film or having different concentration of various impurities such as P, B and As in the film, and also having a practical etching speed to each of the films. The surface treatment for micromachining contains 0.1 to 8 weight percent of hydrogen fluoride and not less than 40 weight percent to not more than 47 weight percent of ammonium fluoride. It should be noted that it is preferable the surface treatment agent contains 0.001 to 1 weight percent of surfactant.

8 Claims, 2 Drawing Sheets

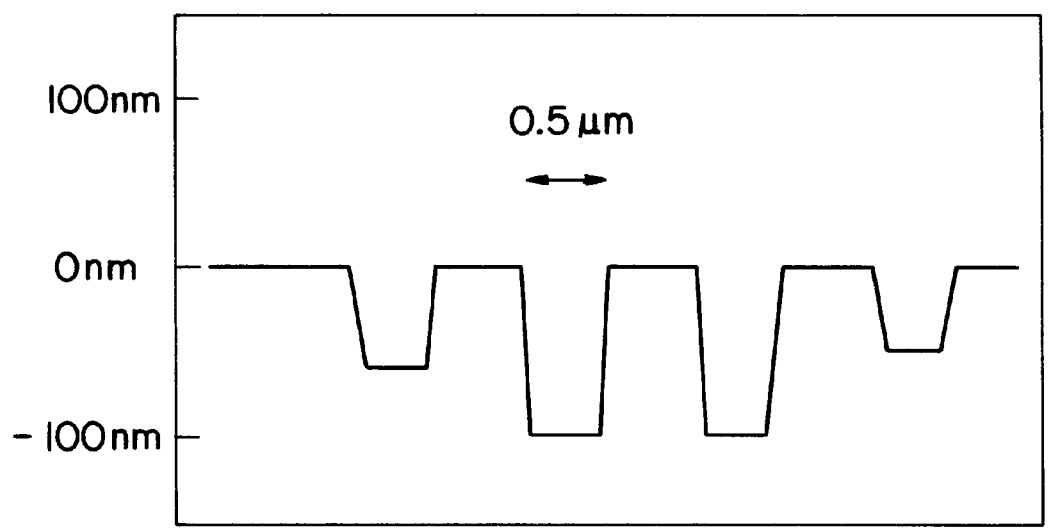
(a) Surfactant not added
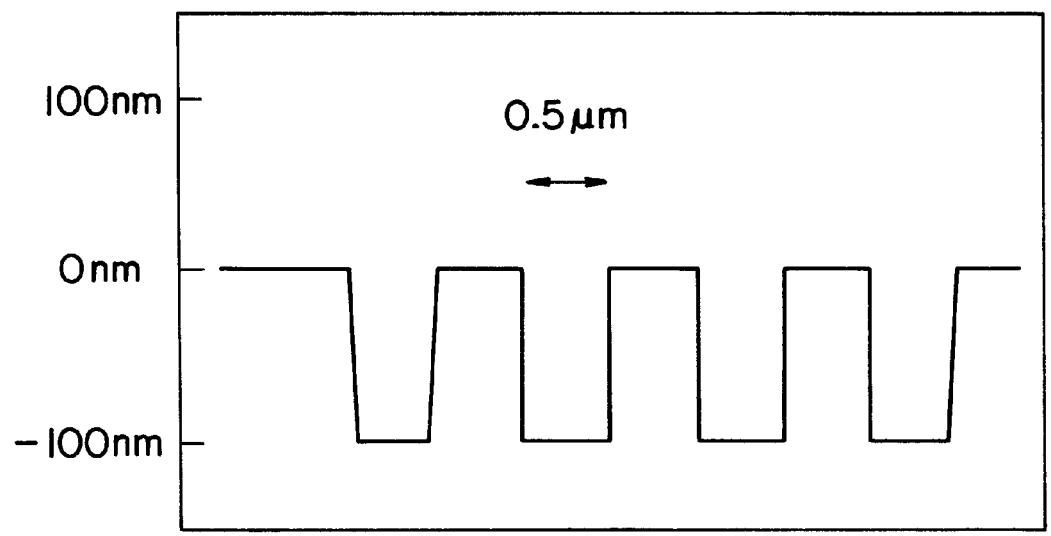
(b) Surfactant added
Fig. 2

SURFACE TREATMENT FOR MICROMACHINING

BACKGROUND OF THE INVENTION

1. Field of the Invention

The present invention relates to a surface treatment for micromachining and, more particularly, to a surface treatment used for fine treatment of silicon oxide in the manufacturing process of semiconductor devices.

2. Description of the Related Art

Fine treatment of film such as oxide film on a wafer surface is one of the most important processes in the manufacturing process of semiconductor integrated circuits. Its importance has been increasingly grown in association with progress of high integration of circuits.

Conventionally, a mixed solution (buffered hydrogen fluoride) of hydrogen fluoride (HF) and ammonium fluoride ($NH_4F$) is applied for fine treatment of film such as oxide film, and is usually prepared by mixing 40 percent $NH_4F$ solution and 50 percent HF solution in various mixing rations such as in a range of 400:1 to 6:1 so as to control etching speed of silicon oxide film from 2.7 nm/min to 120 nm/min.

There are some cases in the manufacturing process of semiconductors that oxide films having various properties are formed depending on each method of forming film as well as on conditions thereof and that those films exist on the same substrate surface. When oxide films having a different property are subjected to etching with the buffered hydrogen fluoride, for example, when an $SiO_2$ film and an $SiO_2$ film containing P are subjected to etching with the buffered hydrogen fluoride, a step is formed at the boundary of the films because of different etching speed of the films.

Although the step of around 50 nm hardly affects the following process in the case of 1 μm design rule semiconductor process, it is clear that in the manufacturing process of submicron semiconductor integrated circuits even the step of around 20 nm causes some trouble to occur in the manufacturing process and that circuit yields are reduced. Namely, it is understood that the step formed in etching process may become larger than from a depth of focus of photolithographic optical system, which induces reduction of yields in the patterning process. Then, it is also clear that this problem will be larger in association with further technological progress to reach a manufacturing process of quarter-micron semiconductor integrated circuits.

An object of the present invention is to provide, in the light of the circumstances described above, a fine surface treatment for micromachining which has nearly the same etching speed for various oxide films, each obtained by a different method as well as conditions of forming film or having different concentration of various impurities such as P, B, and As in the film and which also has a practical etching speed to each of the films.

SUMMARY OF THE INVENTION

According to the present invention a surface treatment for micromachining contains 0.1 to 8 weight percent of hydrogen fluoride and more than 40 weight percent to not more than 47 weight percent of ammonium fluoride.

A surface treatment for micromachining according to the present invention is prepared by dissolving ammonium gas into a solution of hydrogen fluoride.

A surface treatment for micromachining according to the present invention contains 0.001 to 1 weight percent of surfactant.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein:

FIG. 2 is a view conceptional showing an example of a result of measuring the surface of a silicon wafer in Embodiment 7 by an atomic force microscope.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

Figure 1:
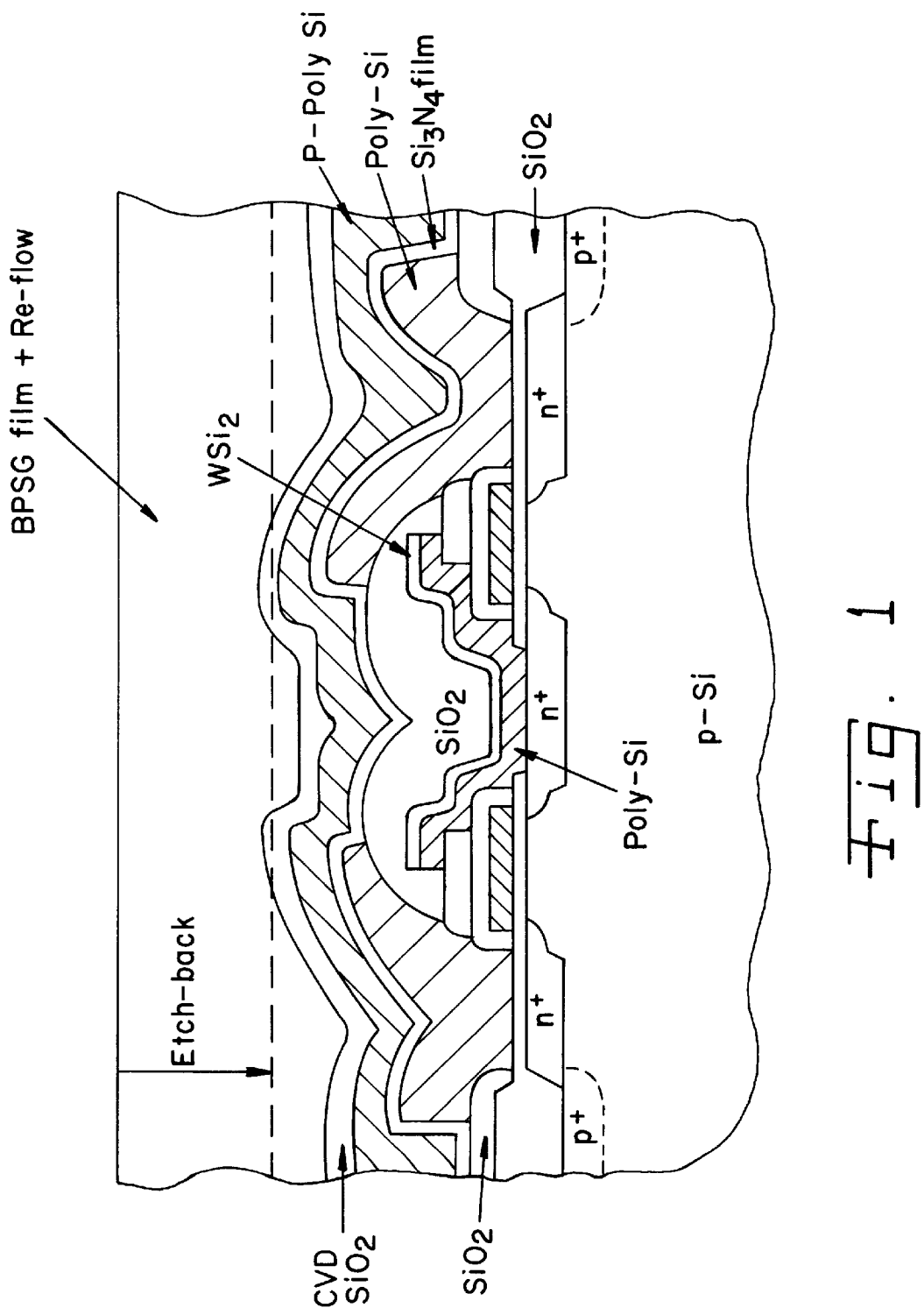
FIG. 1 is a schematic diagram showing a DRAM manufacturing process in Embodiment 5.

Buffered hydrogen fluoride based on the conventional technology has been prepared by mixing a 40 percent $NH_4F$ solution and a 50 percent HF solution. Accordingly, when hydrogen fluoride concentration is controlled, for example, in a range from 0.1 to 8 weight percent, the $NH_4F$ concentration in the solution is in a range from 33.6 to 39.9 percent or less than the value.

On the other hand, the surface treatment for micormachining according to the present invention comprises a mixed solution containing 0.1 to 8 weight percent of hydrogen fluoride and more than 40 weight percent to not more than 47 weight percent of ammonium fluoride ($NH_4F$). It is further preferable that ammonium fluoride is not more than 45 weight percent. With the range of those concentration, it is possible to suppress a ratio of etching from more than 1.1 based on the conventional technology to a range from 1.03 to 1.07 for various types of oxide films irrespective of forming method (for example, thermal oxidation and CVD), thermal treatment condition, or the amount of impurity such as P, As and B in the film.

Namely, a step between oxide films after being subjected to etching is possibly suppressed within the depth of focus in a submicron stepper optical system.

It should be noted that the concentration of hydrogen fluoride is controlled from 0.1 to 8 weight percent in the invention because etching speed becomes 1 nm/min or less for the concentration lower than 0.1 percent and crystal precipitation temperature becomes 35° C. for the concentration higher than 8 percent.

It is preferable that surfactant of 0.001 to 1 weight percent is contained in the surface treatment for micromachining. If a space between resists is around 0.5 μm or less, uniformity in etching to the oxide film is reduced because the our face of oxide films will hardly get wet to surface treatment for fine surface treatment. However, wettability to the resist surface is improved by adding the surfactant to the surface treatment and, as a result, etching uniformity to the silicon oxide film is further improved. If the Si surface is exposed, the roughness of the surface can be suppressed by the surfactant, and for this reason a highly performable device can be realized. The effect of addition of the surfactant thereto is hardly recognized if the concentration is less than 0.001, and the same effect will no longer change for the concentration is higher than 1 percent or more.

Aliphatic amine ($C_nH_{2n+1}NH_2$; n=7 to 14), aliphatic carboxylic acid ($C_nH_{2n+1}COOH$; n=5 to 11) and aliphatic alcohol ($C_nH_{2n+1}OH$; n=6 to 12) are preferably used as a surfactant of the present invention. It is especially preferable to combine at least two types of the three surfactants which are selected for utilization according to $NH_4F$ concentration and HF concentration therein.

The surface treatment for micromachining according to the present invention is prepared as follows.

Namely, the surface treatment can be produced by a method of dissolving high-purity $NH_4F$ powder into a HF solution, a method of mixing a high-purity $NH_4OH$ aqueous solution in high concentration produced by absorbing $NH_3$ gas in ultrapure water and a 50 percent HF solution, and a method of absorbing $NH_3$ gas in a HF aqueous solution (there may be a method of producing $NH_4F$ in high concentration by absorbing $NH_3$ gas in a HF solution and mixing the produced $NH_4F$ and 50 percent HF in a desired ratio) or the like. The method of absorbing $NH_3$ gas in a HF aqueous solution is the most preferable of all because a higher purity solution can be obtained.

However, when $NH_4F$ concentration is more than the saturated concentration, crystal precipitation occurs. Once the precipitation has occurred, it is hard to dissolve the crystal and return to the uniform solution just by increasing temperature by several degrees. This precipitation should be removed to prevent of nonuniformity etching due to particles.

It should be noted that even if the crystallization has occurred it is possible to prevent particles of crystallization from being adhered to the wafer surface by adding the surfactant to the surface treatment.

When a surface treatment for micromachining is actually used in semiconductor production facilities, the surface treatment for micromachining is introduced from a large-sized tank or a medium-sized vessel of around 100 L to a processing bath through a PFA tube or the like. Also, semiconductor production facilities generally maintain a room temperature at a range from 20 to 23° C., and for this reason it is required to control the concentration so that precipitation does not occur at this temperature. Namely, the concentration is required to be not more than 45 percent. If the precipitation temperature of a processing liquid is 18° C., the temperature in the tank and the medium-sized vessel or the tube is required to be not less than 18° C.

The surface treatment for micromachining according to the present invention is used for film such as silicon oxide film, nitride film, and oxide films of polysilicon, Al, Ta, or Ti. As silicon oxide film, there are included film such as thermal oxide film (including dry oxide film and wet oxide film which contains one to eight weight percent of arsenic and phosphorus introduced by means of ion implantation or the like), CVD film (also including film which contains one to eight weight percent of boron, arsenic, and phosphorus), and TEOS film (including film which contains one to eight weight percent of phosphorus and boron).

Embodiment 1

In one form of the invention thereof, an eight-inch silicon wafer was subjected to wet-oxidation for 120 min at 1000° C. to form thermal oxide film with a thickness of 400 nm.

Then, after resist film was obtained, the wafer has formed with a pattern, with each pattern whose one side was 1 mm formed to checkers, $1\times10^{16}/cm^2$ Ion of As implanted to 40 KeV. Then the wafer was subjected to heat treatment for 60 min. at 800° C., and a layer with a thickness of 200 nm including two weight percent of As was formed thereon.

The two types of thermal oxide film formed as described above were subjected to etching at 25° C. by using a solution of 1.0 percent HF concentration and with $NH_4F$ concentration in various degrees. Table 1 shows the result. It should be noted that etching speed of the As-contained thermal oxide film as well as of the thermal oxide film were measured through measurement of film thickness of the oxide films.

TABLE 1

| $NH_4F$ Concentration (%) | Etching rate (nm/min) | | Etching rate ratio As-contained thermal oxide film/ Thermal oxide film | Crystal precipitate temperature (° C.) |
|---|---|---|---|---|
| | As-contained thermal oxide film | Thermal oxide film | | |
| 10.0 | 29.6 | 22.1 | 1.338 | −7 |
| 30.0 | 25.8 | 22.9 | 1.130 | −15 |
| 40.1 | 17.7 | 16.8 | 1.056 | −20 |
| 42.0 | 16.0 | 15.2 | 1.050 | 0 |
| 44.1 | 14.5 | 13.9 | 1.040 | 15 |
| 45.0 | 14.2 | 13.7 | 1.039 | 18 |
| 45.2 | 13.9 | 13.4 | 1.037 | 21 |
| 46.0 | 13.0 | 12.5 | 1.041 | 24.9 |
| 47.0 | 24.0 | 22.8 | 1.053 | 29 |

As clearly understood from Table 1, when the $NH_4F$ concentration was 40.1 percent or more, etching speed ratio between the thermal oxide films was less than 1.06, and a step formed in the process was less than 11.4 nm when the As-contained thermal oxide film had completely been removed. The step was found to give no effect to the process of submicron fine surface treatment. On the other hand, in the concentration based on the conventional technology (30 percent), the etching speed ration was 1.13, and the step was 23 nm.

The etching speed ratio becomes closer to 1.0 as the $NH_4F$ concentration is increased, which is more preferable, but precipitation easily occurs in 46 percent because the precipitation temperature is 24.9° C., and for this reason the temperature has to be controlled with higher precision. It should be noted that occurrence of crystallization generates nonuniformity in etching or the like, which turns out to be some trouble to finer patterns.

With the experiments performed at the etching temperature of 35° C. and using a solution containing $NH_4F$ concentration of 47 percent, it has been found that etching speed ratio was 1.05 and the same etching could be performed without the appearance of a step.

It should be noted that an etching solution at a room temperature is preferable used because there will be larger possibility of elution of impurity from a vessel or the like if the temperature in the solution is increased.

Embodiment 2

In another embodiment, the same evaluation was made by etching with a solution in variations of HF concentration to a silicon wafer by using oxide film formed thereon in the same manner as that of Example 1. It should be noted that $NH_4F$ concentration was 44.1 percent. Table 2 shows the result.

TABLE 2

| $NH_4F$ Concentration (%) | Etching rate (nm/min) As-contained thermal oxide film | Etching rate (nm/min) Thermal oxide film | Etching rate ratio As-contained thermal oxide film/ Thermal oxide film | Crystal precipitate temperature (° C.) |
|---|---|---|---|---|
| 0.1 | 25 | 24 | 1.041 | 13 |
| 0.4 | 62 | 60 | 1.038 | 17 |
| 1.0 | 145 | 139 | 1.040 | 15 |
| 1.6 | 220 | 210 | 1.048 | 13 |
| 2.0 | 267 | 253 | 1.053 | 10 |
| 3.0 | 321 | 305 | 1.051 | 15 |
| 8.0 | 728 | 688 | 1.058 | 24 |

As clearly understood from Table 2, and etching rate can be increased while a ratio of etching speed between the films is kept to be suppressed at a lower level as it is even if HF concentration is increase, and etching can be performed with high precision to various types of film thickness. It was found from the precipitation temperature that the HF concentration is preferable to be not less than 0.1 percent. It was also found that the temperature was less than 24° C. with the concentration of not more than eight percent, and the temperature was less than 15° C. with the concentration of not more than three percent.

Embodiment 3

In another form of the invention thereof, a resist film was formed on an eight-inch silicon wafer with the oxide film in Example 1 formed thereon, a resist pattern of 0.5 $\mu$m×0.5 $\mu$m was open by being exposed and developed. As a result, this wafer was subjected to etching with an etching solution containing 1.0 percent HF and 42.0 percent $NH_4F$ and with an etching solution further containing $C_8H_{17}NH_2$ (100 ppm) and $C_7H_{15}COOH$ (100 ppm), nonuniformity of etching within the silicon wafer was three percent with the solution containing surfactant, which made it clear that the uniformity could be higher as compared to the solution with no surfactant included (10 percent).

Embodiment 4

In yet another form of the invention thereof, non-doped $SiO_2$ film and $SiO_2$ (BPSG) film in which B and P had been doped were formed on a silicon wafer by a thermal CVD method, and etching speed rations were measured using etching solutions having various types of composition. Table 3 shows the result. It should be noted that etching temperature was set to 25° C. Also, the conditions for forming film are as follows.

Non-doped $SiO_2$ film:

Gas: $SiH_4:N_2O=1:10$
Pressure: 0.02 atm
Temperature: 600° C.
BPSG film:

Gas: $SiH_4:O_2:B_2H_6:PH_3=10:1000:2:1$
Pressure: 1.2 atm
Temperature: 400° C.

TABLE 3

| $NH_4F$ Concentration (%) | HF Concentration (%) | Etching rate (nm/min) BPSG | Etching rate (nm/min) Non-doped film | Ratio between etching rates BPSG/Non-doped |
|---|---|---|---|---|
| 5.0 | 1.0 | 56.7 | 19.8 | 2.864 |
| 10.0 | 1.0 | 50.0 | 22.1 | 2.263 |
| 15.0 | 1.0 | 31.2 | 22.1 | 1.415 |
| 20.0 | 1.0 | 29.0 | 13.8 | 1.218 |
| 20.0 | 2.0 | 59.0 | 50.1 | 1.178 |
| 20.0 | 4.0 | 98.9 | 82.3 | 1.202 |
| 30.0 | 1.0 | 25.5 | 22.9 | 1.116 |
| 30.0 | 2.0 | 53.6 | 47.8 | 1.121 |
| 40.0 | 1.0 | 18.2 | 16.8 | 1.083 |
| 40.0 | 2.0 | 32.9 | 30.2 | 1.089 |
| 42.0 | 1.0 | 15.9 | 15.2 | 1.046 |
| 42.0 | 2.0 | 31.2 | 29.5 | 1.058 |
| 43.0 | 2.0 | 29.6 | 28.3 | 1.046 |
| 44.0 | 1.0 | 14.2 | 13.7 | 1.036 |
| 44.0 | 2.0 | 28.6 | 27.3 | 1.048 |
| 45.0 | 1.0 | 13.0 | 12.6 | 1.032 |
| 45.0 | 2.0 | 26.3 | 25.2 | 1.044 |

As clearly understood from Table 3, it has been found that the etching speed ration could be smaller if the $NH_4F$ concentration was controlled for exceeding 40 percent even if the films were CVD film, thus a step formed after the etching being suppressed.

Embodiment 5

In another form of the invention thereof, in the manufacturing process of DRAM memory cells, as shown in FIG. 1, a film of p-polysilicon, and then non-doped CVD ($SiO_2$) film were formed. Then, BPSG film for smoothing a surface was formed and subjected to thermal re-flow, and then the surface of the film was smoothed by subjecting this BPSG film to etch-back.

The BPSG film and the non-doped $SiO_2$ film were formed under the same conditions as described in Example 4. Also, the re-flow was carried out in a nitrogen gaseous atmosphere at the temperature of 900° C.

The etching was performed, so as to leave the non-doped $SiO_2$ film by at least 50 nm, with an etching solution I (containing 44 percent $NH_4F$ and 1.0 percent HF) as well as with an etching solution II (containing 30 percent $NH_4F$ and 1.0 percent HF) at 25° C.

As a result of observation on the surface after the etching, it was found that the step formed on the surface was 7 nm when the etching solution I was used and was 20 nm when the etching solution II was used.

Embodiment 6

In another form of the invention thereof, effects due to addition of surfactant to the solution was studied.

At first, as an etching solution, a solution of 43 percent $NH_4F$ and 2.0 percent HF and a solution obtained by further adding the same surfactant as described in Example 3 to this solution were left at the temperature of (−5° C.), lower than the precipitation temperature (2° C.).

The number of particles whose diameter is not less than 0.2 $\mu$m was measured in the solution before and after the solutions were left by using a particle measuring device based on a laser diffusion system (KL-22 produced by RION).

A six-inch silicon wafer was taken out, after soaking in the various types of solutions for five minutes and the number of particles on the wafer surface was measured by using a wafer-surface foreign matter measuring device based on a laser diffusion system (Surfscan 6200 produced by TENCOL). Table 4 shows the result of measuring the number of particles in the solution as well as on the wafer surface.

TABLE 4

| Chemical | | The number of submerged particles (unit/ml) | The number of particles on the wafer surface (unit/wafer) |
| --- | --- | --- | --- |
| Surfactant/ Without | Before being left | 50 | 48 |
| | After being left | 2350 | 1200 |
| Surfactant/With | Before being left | 53 | 15 |
| | After being left | 2500 | 14 |

The crystal precipitation increases when the temperature in the solution is less than the precipitation temperature, and the precipitation induces nonuniformity in etching or the like, but, as clearly understood from Table 4, addition of the surfactant to the solution makes it possible to suppress the number of particles to be adhered on the wafer and to prevent nonuniformity in etching although particles in the solution can not be reduced.

Namely, even if a large number of crystallizations exist in the solution, those particles are not adhered on the wafer surface, so that it is possible to prevent a reduction of etching yields. Accordingly, any etching solution can easily be managed.

Embodiment 7

In another form of the invention thereof, resist film (1 μm) was formed on an eight-inch silicon wafer with 1 μm-thermal oxide film formed thereon, and 2,000 units of pattern for each of various-sized contact holes were formed on the oxide film.

Then, the thermal oxide film was etched by about 100 nm for four min at 25°C. by using an etching solution containing 45 percent $NH_4F$ and 2.0 percent HF or an etching solution obtained by adding the surfactant (200 ppm in total) in Example 3 to the etching solution described above.

After the etching, the resist was peeled with a mixed solution of sulfuric acid and hydrogen peroxide, and then the surface was inspected by the atomic force microscope (Nano Spec III produced by Digital Instruments).

FIG. 2 shows one of surface patterns measured by the atomic force microscope, and Table 5 shows a relationship between the diameters of contact holes and defective rate of contact holes.

TABLE 5

| Etching solution | Diameter of contact holes | Defective contact holes |
| --- | --- | --- |
| Surfactant/Without | 2.0 | 10 |
| | 1.0 | 20 |
| | 0.5 | 45 |
| Surfactant/With | 2.0 | 0 |
| | 1.0 | 0 |
| | 0.5 | 0 |

As shown in Table 5 as well as in FIG. 2, the addition of the surfactant to the solution makes it possible to completely eliminate defectiveness in etching even for a fine pattern.

Although it is also possible to soak the film once in ultrapure water with the surfactant added thereto and then to subject the soaked film to etching with an etching solution without adding directly the surfactant to the etching solution, some troubles such as incoming dusts and solution of the etching solution easily occur, and for this reason previous addition of surfactant to an etching solution is preferable.

The surface treatment for micromachining according to the present invention, namely the surface treatment containing 0.1 to 8 weight percent of hydrogen fluoride and more than 40 weight percent to not more than 47 weight percent of ammonium fluoride can make a smaller difference between each speed of etching to oxide films each obtained by a different method and conditions of forming film as compared with those of the etching solution based on the conventional technology.

As a result, a step on an oxide film generated in an etching process can be suppressed, and for this reason submicron- and further quarter-micron-ultra fine surface treatment can also be carried out with high yields.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A surface treatment for micromachining the surface treatment comprising 0.1 to 8 weight percent of hydrogen fluoride and more than 40 weight percent to not more than 47 weight percent of ammonium fluoride.

2. A surface treatment for micromachining according to claim 1 prepared by dissolving ammonium gas into a solution of hydrogen fluoride.

3. A surface treatment for micromachining according to claim 1 containing 0.001 to 1 weight percent of surfactant.

4. A surface treatment for micromachining according to claim 2 containing 0.001 to 1 weight percent of surfactant.

5. A method for micromachining, comprising the step of:
   Applying a surface treatment containing 0.1 to 8 weight percent of hydrogen fluoride and more than 40 weight percent to not more than 47 weight percent of ammonium fluoride.

6. The method of claim 5 further comprising the step:
   Preparing the surface treatment by dissolving ammonium gas in a solution of hydrogen fluoride.

7. The method of claim 5 wherein the surface treatment further contains 0.001 to 1 weight percent of the surfactant.

8. The method of claim 6 wherein the surface treatment contains 0.001 to 1 weight percent of the surfactant.

* * * * *

UNITED STATES PATENT AND TRADEMARK OFFICE
CERTIFICATE OF CORRECTION

PATENT NO.    : 6,027,571
DATED         : February 22, 2000
INVENTOR(S)   : Hirohisa Kikuyama et al.

It is certified that error appears in the above-identified patent and that said Letters Patent is hereby corrected as shown below:

Column 8,
Line 43, " the surface" should read -- a surface --.

Signed and Sealed this

Fourth Day of February, 2003

JAMES E. ROGAN
*Director of the United States Patent and Trademark Office*